(12) United States Patent
Ng et al.

(10) Patent No.: US 9,972,368 B2
(45) Date of Patent: May 15, 2018

(54) CIRCUITRY FOR REDUCING LEAKAGE CURRENT IN CONFIGURATION MEMORY

(71) Applicant: Altera Corporation, San Jose, CA (US)

(72) Inventors: Bee Yee Ng, Bayan Lepas (MY); Gaik Ming Chan, Butterworth (MY); Ping-Chen Liu, Fremont, CA (US); Thien Le, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days. days.

(21) Appl. No.: 15/283,011

(22) Filed: Sep. 30, 2016

(65) Prior Publication Data

US 2018/0096714 A1    Apr. 5, 2018

(51) Int. Cl.
    *G11C 7/10*    (2006.01)
    *G11C 5/06*    (2006.01)

(52) U.S. Cl.
    CPC . *G11C 7/10* (2013.01); *G11C 5/06* (2013.01)

(58) Field of Classification Search
    None
    See application file for complete search history.

(56) References Cited

U.S. PATENT DOCUMENTS

| | | |
|---|---|---|
| 5,940,852 A | 8/1999 | Rangasayee et al. |
| 6,711,646 B1 | 3/2004 | Pelissier et al. |
| 6,822,486 B1 * | 11/2004 | King ............... H04J 3/047 327/407 |
| 6,914,449 B2 | 7/2005 | Kaviani |
| 7,019,557 B2 | 3/2006 | Madurawe |
| 7,023,744 B1 | 4/2006 | Shimanek et al. |
| 7,500,060 B1 | 3/2009 | Anderson et al. |
| 7,930,666 B1 | 4/2011 | Schmit et al. |
| 8,434,045 B1 | 4/2013 | Schmit et al. |
| 2004/0257860 A1 * | 12/2004 | Fenstermaker .......... G11C 7/12 365/156 |
| 2005/0190597 A1 * | 9/2005 | Kato ............... G11C 11/22 365/185.08 |
| 2012/0039142 A1 * | 2/2012 | Pan ............... G11C 7/1045 365/203 |
| 2014/0268998 A1 | 9/2014 | Jo |
| 2015/0162076 A1 * | 6/2015 | Wang ............... G11C 7/1048 365/154 |

(Continued)

*Primary Examiner* — Uyen B Tran
(74) *Attorney, Agent, or Firm* — Treyz Law Group, P.C.; Jason Tsai

(57) ABSTRACT

Integrated circuits may include dual mode memory cells. Dual mode memory cells may be operated in a lookup-table mode or a memory mode. A dual mode memory cell may have configuration ports for supporting a configuration operation and user ports for supporting a user mode operation. When performing configuration operations in the memory mode, the configuration ports may be gated off to prevent existing user data from being accessed. Each column of memory cells may be arranged into groups. Each group of memory cells in a column may be connected to a respective local data line, which is connected to a global data line via a switch. The switch may be selectively activated to short the local data line to the global data line. Configured in this hierarchical data line architecture, leakage at the global data line can dramatically be reduced, and the memory cell read margin is improved.

14 Claims, 8 Drawing Sheets

(56) References Cited

U.S. PATENT DOCUMENTS

2015/0279462 A1    10/2015  Iyer et al.
2016/0020767 A1*    1/2016  Sharpe-Geisler .. H03K 19/0013
                                                326/41

* cited by examiner

CIRCUITRY FOR REDUCING LEAKAGE CURRENT IN CONFIGURATION MEMORY

BACKGROUND

This relates to integrated circuits and more particularly, to programmable integrated circuits.

Programmable integrated circuits are a type of integrated circuit that can be programmed by a user to implement a desired custom logic function. In a typical scenario, a logic designer uses computer-aided design (CAD) tools to design a custom logic circuit. When the design process is complete, the computer-aided design tools generate configuration data. The configuration data is loaded into memory elements to configure the devices to perform the functions of the custom logic circuit.

Memory elements are often formed using random-access-memory (RAM) cells. Because the RAM cells are loaded with configuration data during device programming, the RAM cells are sometimes referred to as configuration memory or configuration random-access-memory cells (CRAM). During normal operation of a programmable device, loaded CRAM cells produce static output signals that are applied to the gates of transistors (e.g., pass transistors). The CRAM output signals turn some transistors on and turn other transistors off. This selective activation of certain transistors on the programmable device customizes the operation of the programmable device so that the programmable device performs its intended function.

Each memory cell typically includes a bistable storage circuit (i.e., a storage circuit that includes two cross-coupled inverters) that is coupled to data lines via address transistors. The address transistors are controlled by address signals. During read and write operations, the address signals may be selectively asserted to access a subset of memory cells. In a 14 nanometer (nm) process, the bistable storage portion may be powered using a nominal voltage supply of 0.90 V and a ground voltage supply of 0 V.

In an effort to improve read/write margin and reduce leakage in the memory cells, the address signals may be driven from an overdrive voltage of 1.1 V to a negative voltage of −0.1 V. In certain applications, the address signals to the memory cells have to be gated using gating logic. The gating logic is implemented using thin-gate devices, which can only withstand a maximum voltage swing of 1.13 V in the 14 nm process. However, driving the gating logic between 1.1 V and −0.1 V results in an overall voltage swing of 1.2 V (1.1 minus −0.1), which violates the maximum tolerable voltage swing. This violation could result in undesirable device reliability issues and could cause breakdown and defects in the memory cells.

It is within this context that the embodiments described herein arise.

SUMMARY

An integrated circuit that includes an array of dual mode memory cells is provided. Each dual mode memory cell may be operated in either a lookup-table mode (LUT mode) or a memory mode such as random-access memory (RAM mode) or shift-register (DLM) mode. When operating in the lookup-table mode, the dual mode memory cell(s) store configuration data that define the operation of the LUT, which represent combinational logic of the programmable circuit design. When operating in the memory mode, the dual mode memory cell(s) operate as cells of random access memory or as cells of a shift register that hold active user data. By selectively storing either configuration data or user data, the dual memory cell array may operate either as configurable logic or as a cell of user-accessible memory depending on the programmable circuit design that is in use.

The array of dual mode memory cells may be coupled in a hierarchical data line routing arrangement to help reduce data line leakage. For example, each column of memory cells may be organized into multiple groups of memory cells. Each memory cell in a group may be directly connected to a respective local data line. The local data line may then be selectively coupled to a global data line that is shared among the groups in that column via corresponding circuits (e.g., pass gate transistors or bidirectional tristate buffers).

Configured in this hierarchical routing arrangement, data line leakage can be reduced by only allowing the global data line to be coupled to a selected subset of groups in each column. Thus, address signals used to access each dual mode memory cell during the user memory mode and the lookup-table mode can be driven down to a ground voltage (e.g., zero volts) instead of having to drive the address signals to a negative voltage in order to meet power consumption criteria. This also obviates the need for large level shifters and thick-gate devices at the addressing ports.

Further features of the invention, its nature and various advantages will be more apparent from the accompanying drawings and following detailed description.

DETAILED DESCRIPTION

Embodiments of the present invention relate to integrated circuits and more particularly, to integrated circuits with memory elements. It will be recognized by one skilled in the art, that the present exemplary embodiments may be practiced without some or all of these specific details. In other instances, well-known operations have not been described in detail in order not to unnecessarily obscure the present embodiments.

Integrated circuits such as programmable integrated circuits use programmable memory elements to store configuration data. During programming of a programmable integrated circuit, configuration data is loaded into the memory elements. During normal operation of the programmable integrated circuit, each memory element provides a static output signal. The static output signals that are supplied by the memory elements serve as control signals. These control signals are applied to programmable logic on the integrated circuit to customize the programmable logic to perform a desired logic function.

Memory elements may be organized in arrays having numerous rows and columns. For example, memory array circuitry may be formed in hundreds or thousands of rows and columns on a programmable logic device integrated circuit. Programmable integrated circuit 10 of FIG. 1 is an example of an illustrative integrated circuit on which memory array circuitry may be formed.

Figure 1:
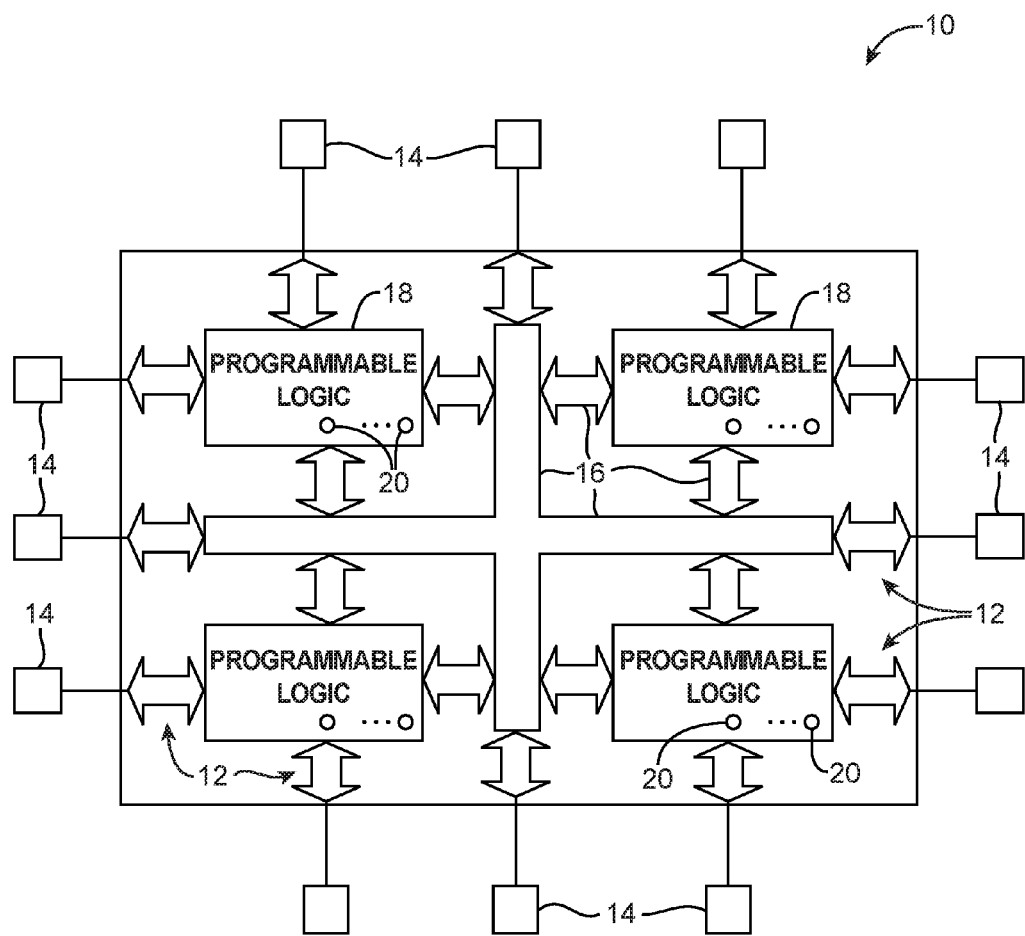
FIG. 1 is a diagram of an illustrative programmable integrated circuit in accordance with an embodiment.

As shown in FIG. 1, programmable integrated circuit 10 may have input-output circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function.

Programmable integrated circuit 10 contains memory elements 20 that can be loaded with configuration data (also called programming data) using pins 14 and input-output circuitry 12. Once loaded, the memory elements each provide a corresponding static control output signal that controls the state of an associated logic component in programmable logic 18. Typically the memory element output signals are used to control the gates of metal-oxide-semiconductor (MOS) transistors. Some of the transistors may be p-channel metal-oxide-semiconductor (PMOS) transistors. Many of these transistors may be n-channel metal-oxide-semiconductor (NMOS) pass transistors in programmable components such as multiplexers. When a memory element output is high, an NMOS pass transistor controlled by that memory element will be turned on to pass logic signals from its input to its output. When the memory element output is low, the pass transistor is turned off and does not pass logic signals.

A typical memory element 20 is formed from a number of transistors configured to form cross-coupled inverters. Other arrangements (e.g., cells with more distributed inverter-like circuits) may also be used. With one suitable approach, complementary metal-oxide-semiconductor (CMOS) integrated circuit technology is used to form the memory elements 20, so CMOS-based memory element implementations are described herein as an example. In the context of programmable integrated circuits, the memory elements store configuration data and are therefore sometimes referred to as configuration random-access memory (CRAM) cells.

Figure 2:
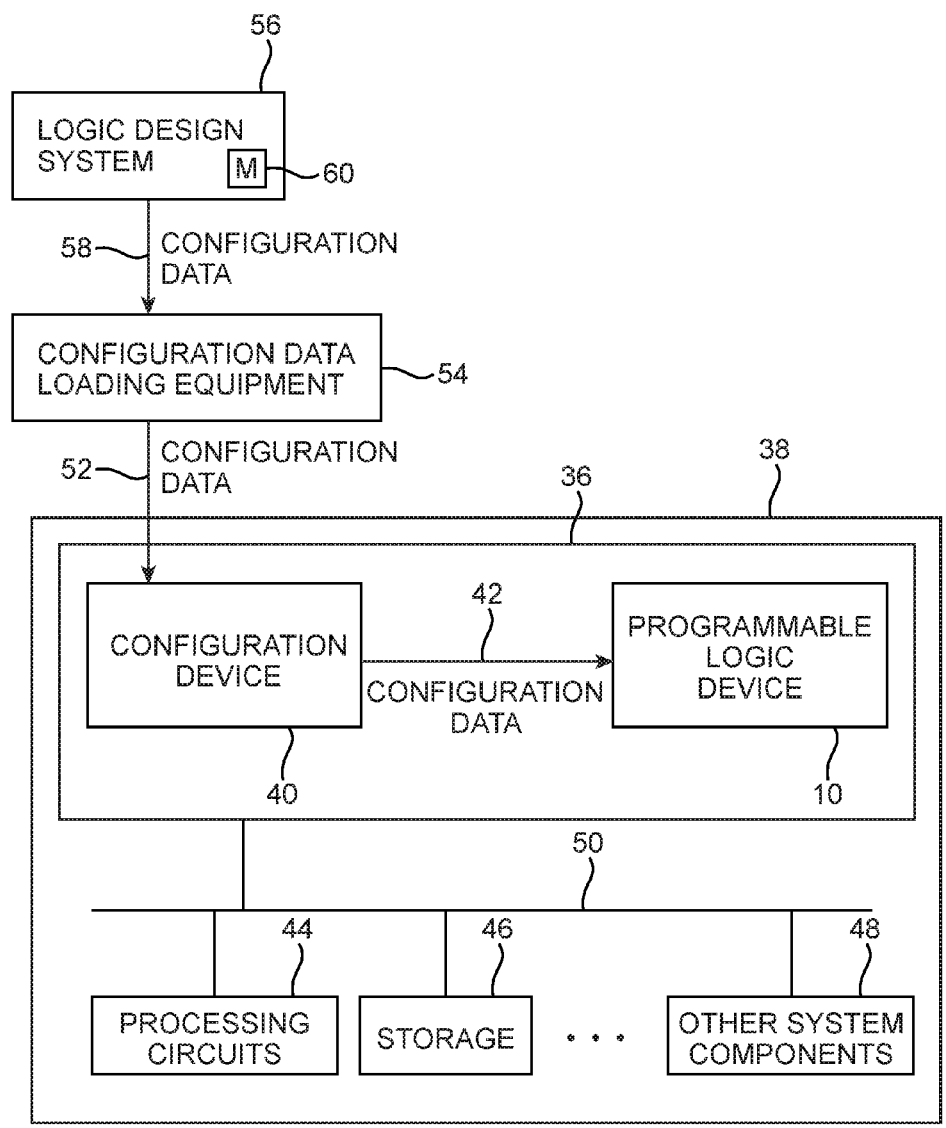
FIG. 2 is a diagram showing how configuration data is created by a logic design system and loaded into a programmable device to configure the device for operation in a system in accordance with an embodiment.

An illustrative system environment for device 10 is shown in FIG. 2. Device 10 may be mounted on a board 36 in a system 38. In general, programmable logic device 10 may receive configuration data from programming equipment or from other suitable equipment or device. In the example of FIG. 2, programmable logic device 10 is the type of programmable logic device that receives configuration data from an associated integrated circuit 40. With this type of arrangement, circuit 40 may, if desired, be mounted on the same board 36 as programmable logic device 10. Circuit 40 may be an erasable-programmable read-only memory (EPROM) chip, a programmable logic device configuration data loading chip with built-in memory (sometimes referred to as a configuration device), or other suitable device. When system 38 boots up (or at another suitable time), the configuration data for configuring the programmable logic device may be supplied to the programmable logic device from device 40, as shown schematically by path 42. The configuration data that is supplied to the programmable logic device may be stored in the programmable logic device in its configuration random-access-memory elements 20.

System 38 may include processing circuits 44, storage 46, and other system components 48 that communicate with device 10. The components of system 38 may be located on one or more boards such as board 36 or other suitable mounting structures or housings and may be interconnected by buses and other electrical paths 50.

Configuration device 40 may be supplied with the configuration data for device 10 over a path such as path 52. Configuration device 40 may, for example, receive the configuration data from configuration data loading equipment 54 or other suitable equipment that stores this data in configuration device 40. Device 40 may be loaded with data before or after installation on board 36.

It can be a significant undertaking to design and implement a desired logic circuit in a programmable logic device. Logic designers therefore generally use logic design systems based on computer-aided-design (CAD) tools to assist them in designing circuits. A logic design system can help a logic designer design and test complex circuits for a system. When a design is complete, the logic design system may be used to generate configuration data for electrically programming the appropriate programmable logic device.

As shown in FIG. 2, the configuration data produced by a logic design system 56 may be provided to equipment 54 over a path such as path 58. The equipment 54 provides the configuration data to device 40, so that device 40 can later provide this configuration data to the programmable logic device 10 over path 42. System 56 may be based on one or more computers and one or more software programs. In general, software and data may be stored on any computer-readable medium (storage) in system 56 and is shown schematically as storage 60 in FIG. 2.

In a typical scenario, logic design system 56 is used by a logic designer to create a custom circuit design. The system 56 produces corresponding configuration data which is provided to configuration device 40. Upon power-up, configuration device 40 and data loading circuitry on programmable logic device 10 is used to load the configuration data into CRAM cells 20 of device 10. Device 10 may then be used in normal operation of system 38.

In accordance with an embodiment, integrated circuit die 10 may include a dual mode memory element such as dual mode memory cell 300 that can be configured to operate as either: (1) a normal CRAM or (2) a user memory cell for storing user data. In the first mode (sometimes referred to herein as a lookup-table mode), memory cell 300 can be used to supply configuration bits for a lookup table (LUT), to supply control bits for a multiplexing circuit, or to supply configuration bits for other routing and programmable circuitry on device 10 (as examples).

In particular, dual mode memory cell 300 may have a configuration write port that can be used to load configuration data into cell 300 and a configuration read port that can be used to read configuration data from cell 300. The configuration read/write ports may be addressed using signals swinging between an elevated supply voltage Vcchg and a negative supply voltage Vneg. For example, elevated supply voltage Vcchg (sometimes referred to as an "overdrive" voltage) may be equal to 1.1 V. Negative supply voltage Vneg (sometimes referred to as an "underdrive" voltage) may be equal to −0.1 V. The configuration read/write ports may be activated during full device configuration (e.g. an operation in which a full configuration image programs the entire device), partial reconfiguration (e.g., an operation in which only part of the device is being reconfigured), scrubbing (e.g., an operation in which desired data is being reloaded into the device), error detection and correction operations such as cyclic redundancy check (CRC) operations, and/or other types of configuration processes.

In the second mode (sometimes referred to herein as the memory mode), memory cell 300 may be utilized to store user data, which can change throughout normal operation of device 10, or operated as a shift register (as examples). Memory cell 300 may also be coupled to a user write port for loading user data into cell 300 and to a user read port for loading user data from cell 300. The user read/write ports may be addressed using signals swinging between elevated supply voltage Vcchg and ground supply voltage Vss (e.g., zero volts). Memory cell 300 that is operable both as a configuration RAM and as a user RAM is sometimes referred to as a lookup table random-access memory (LUTRAM).

When a given memory cell 300 is operating in the memory mode, the configuration read and write ports need to be gated-off to prevent existing user data in memory cell 300 from being overwritten and read out during partial reconfiguration, scrubbing, error detection and correction, and other configuration operations. As such, gating logic 302 may be inserted at the configuration write port, whereas gating logic 304 may be inserted at the configuration read port.

Figure 3:
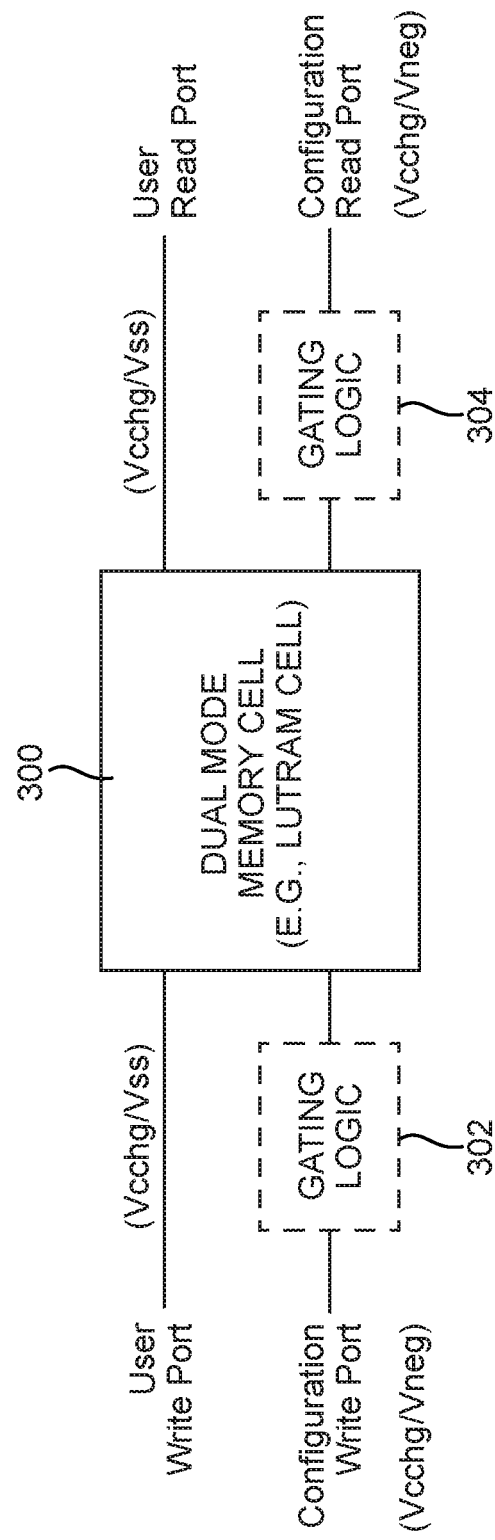
FIG. 3 is a diagram of an illustrative dual mode memory element in accordance with an embodiment.

As described above, the configuration read and write ports may be driven to negative voltage level Vneg to help minimize the data line leakage. Driven in this way, however, the maximum tolerable voltage swing Vmax for thin-gate devices as set by the current processing node might be exceeded. For example, toggling the configuration address signals between a Vcchg of 1.1 V and a Vneg of 0.1 V will violate a Vmax of 1.13 V (i.e., 1.2 V exceeds 1.13 V). In order to prevent Vmax from being violated, gating logic 302 and 304 of FIG. 3 will have to be implemented using a Vcchg/Vneg level shifter or a 1.2 V thick-gate device. Either implementation will, however, increase cost dramatically as level shifters and thick-gate devices can take up a significant amount of chip area. Alternatively, the configuration address signals can instead be driven to only zero volts to satisfy Vmax requirements. Doing so would, however, increase data line leakage current dramatically (e.g., by a factor of six or more). Hence, the memory cell 300 read margin is reduced due to the increase in data line leakage. It would therefore be desirable to provide an improved memory cell architecture that can minimize power consumption while keeping cost low (i.e., an arrangement that minimizes leakage without requiring big level shifters or large thick-gate devices).

Each dual mode memory cell may be coupled to one or more data lines. In general, the dual mode memory cells may be arranged in an array, where a column of memory cells is coupled to a respective data line. For example, a column of memory cells may include 92 dual mode memory cells coupled to one data line. The large number of memory cells connected to that data line contributes a large amount of loading at the data line, which can cause a substantial amount of leakage current on the programmable device 10.

Figure 4:
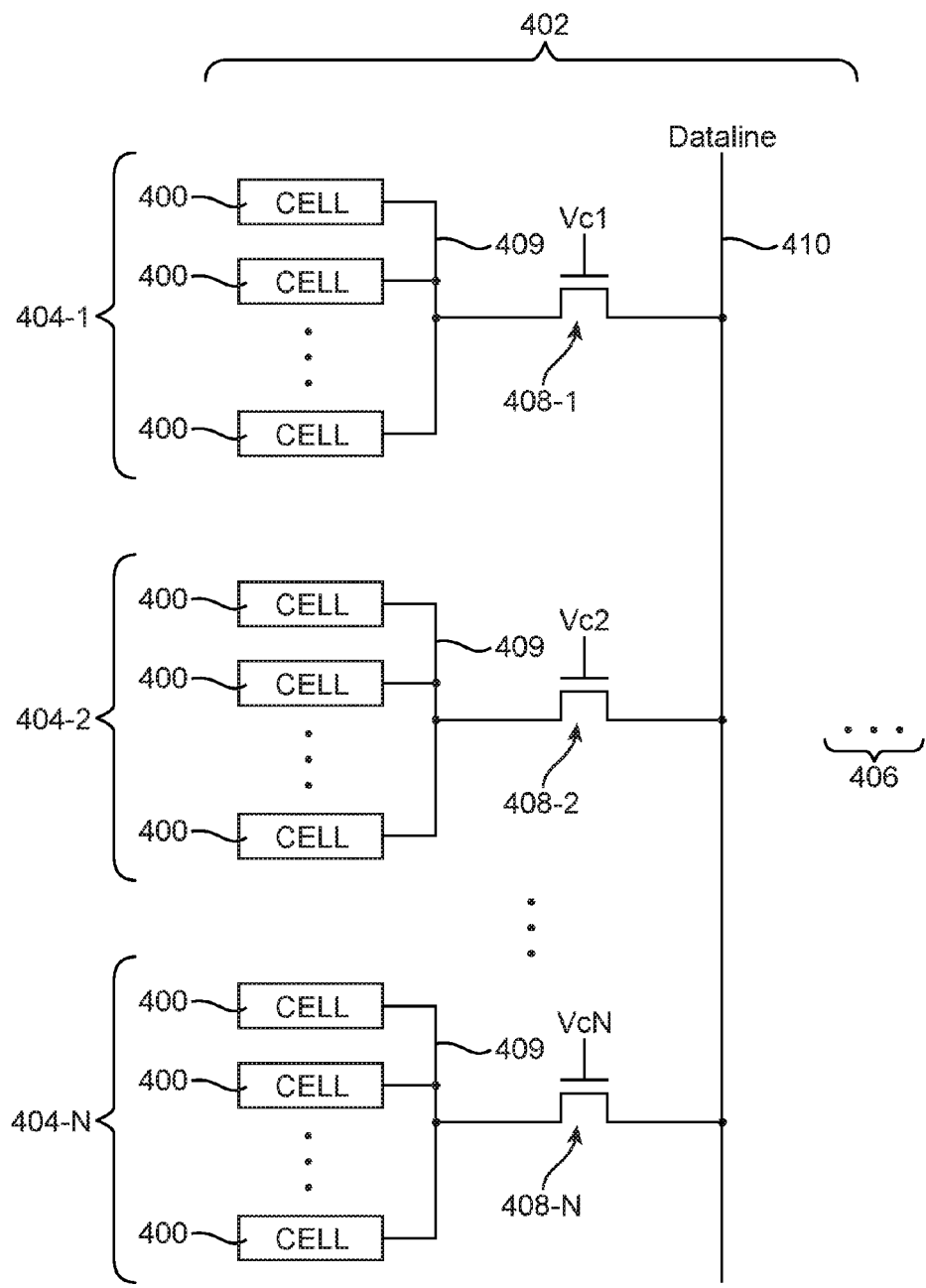
FIG. 4 is a diagram of a column of memory elements with a hierarchical data line arrangement in accordance with an embodiment.

In an effort to help reduce the data line leakage, the dual mode memory cells may be interconnected in a hierarchical data line approach illustrated in FIG. 4. As shown in FIG. 4, a column such as column 402 may include dual mode memory elements 400 (e.g., LUTRAM memory cells) organized into multiple groups. For example, a first group 404-1 of memory cells 400 may be coupled to a first local data line 409, which is then coupled to global data line 410 via switch 408-1. Similarly, a second group 404-2 of memory cells 400 may be coupled to a second local data line 409, which is then coupled to global data line 410 via switch 408-2. Likewise, an $n^{th}$ group 404-N of memory cells 400 may be coupled to yet another local data line 409, which is also coupled to global data line 410 via switch 408-N. In general, each group 404 may include any number of dual mode memory cells 400 providing the data line leakage reduced to an acceptable range. Each group 404 may include the same number of memory cells 400 or may include a different number of memory cells 400. Each group 404 may include at least four LUTRAM cells 400, at least ten LUTRAM cells 400, at least twenty LUTRAM cells 400, etc. Column 402 may be one of many columns in an array of memory cells 400, as indicated by ellipses 406.

One of groups 404 may be selectively connected to global data line 410 by asserting one of control signals Vc1-VcN. In particular, signal Vc1 controls switch 408-1; signal Vc2 controls switch 408-2; . . . ; and signal VcN controls switch 408-N. In other words, to access one of memory cells 400 in group 404-2, signal Vc2 may be asserted (e.g., signal Vc2 may be driven high to a logic "1" while all other control signals remain deasserted at logic "0") to connect second local data line 409 to global data line 410. By selectively coupling global data line 410 to at most one of groups 404, the loading at global data line 410 is reduced dramatically (e.g., the capacitive loading at global data line 410 may be reduced by a factor that is equal to the number of groups), which helps minimize data line leakage current and hence improves the dual mode memory cell read margin. There may be a separate global data line for each column of memory cells.

By limiting the amount of loading at data line 410, the need to address the read/write ports using a negative supply voltage may be obviated. In other words, leakage can still be kept low while the configuration read/write addressing signals swing between elevated voltage Vcchg and ground voltage Vss. See, c.f., FIG. 3 (where the configuration write and read ports toggle between Vcchg and negative voltage Vneg). By allowing the address signals to swing between voltage levels Vcchg and Vss, the configuration port gating logic circuits can be implemented using thin-gate devices without the need of large level shifters and still meet Vmax requirements. The hierarchical data line architecture therefore allows the address signals to be driven to ground voltage Vss (instead of Vneg) while keeping leakage current low and while minimizing any area overhead.

Figure 5A:
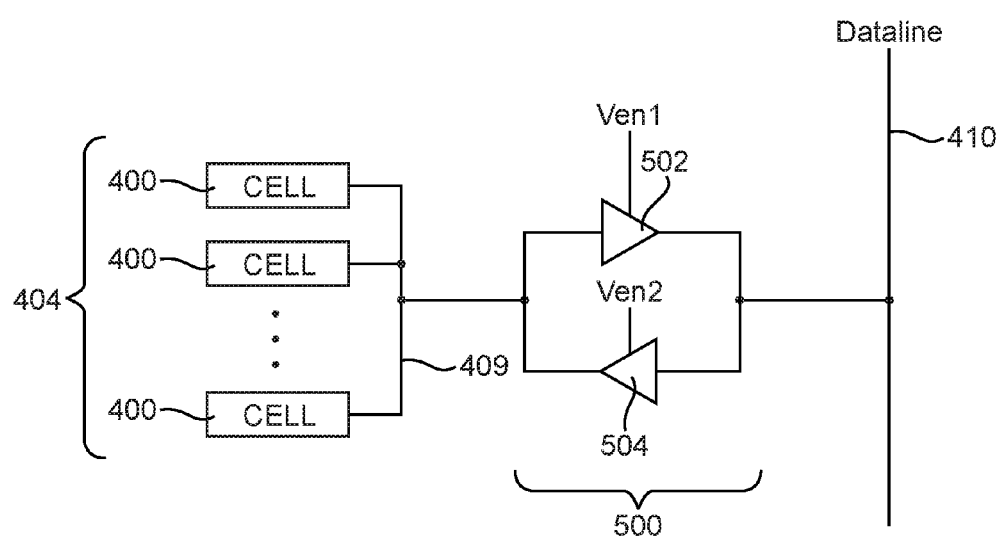
FIG. 5A is a diagram showing how a local data line may be coupled to a global data line via a bidirectional tristate buffer in accordance with an embodiment.

Each switch 408 (e.g., switch 408-1, 408-2, . . . , 408-N) may be implemented using an n-channel pass gate transistor, as shown in the example of FIG. 4. Control signals Vc1-VcN may be generated using an associated control logic block. Alternatively, switches 408 may be implemented using p-channel pass gate transistors or transmission gate circuits (e.g., n-channel and p-channel pass gate transistors coupled in parallel). In yet another suitable arrangement, switch 408 may be implemented as a bidirectional tristate buffer such as buffer 500 of FIG. 5A. As shown in FIG. 5A, buffer 500 may include a first buffer 502 that drives signals from local data line 409 towards global data line 410 and a second buffer 504 that drives signals from global data line 410 to local data line 409. Buffer 502 may be selectively activated using enable signal Ven1, whereas buffer 504 may be selectively switched into use by asserting enable signal Ven2. The use of buffer 500 may help improve the LUTRAM cell write margins. In general, other suitable types of switching or driver circuit may be implemented to selectively connect each local data line 409 to the corresponding global data line 410.

Figure 5B:
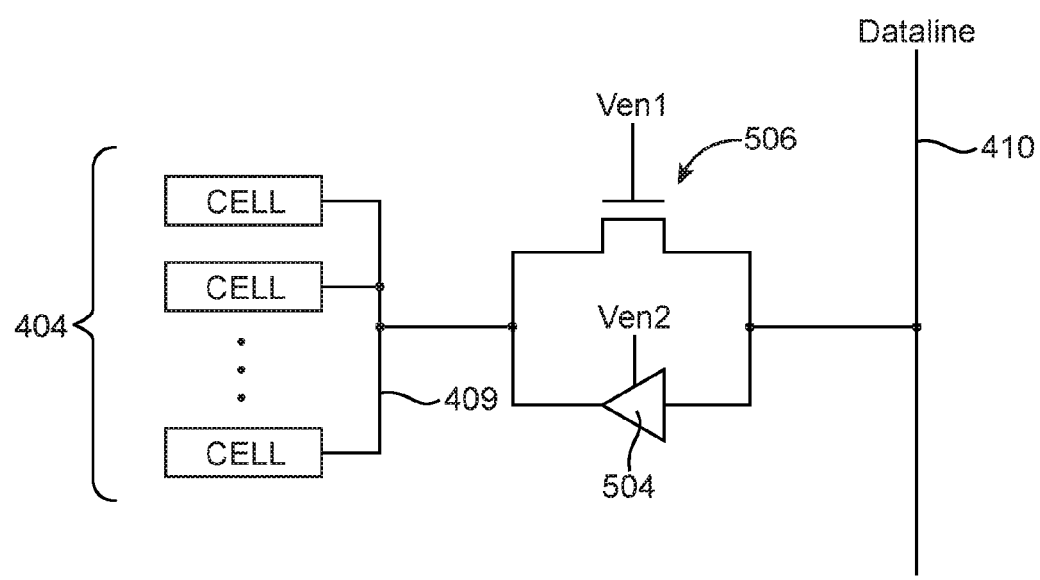
FIG. 5B is a diagram showing how a local data line may be coupled to a global data line via a pass gate and a tristate buffer in accordance with an embodiment.

FIG. 5B shows yet another suitable embodiment where n-channel pass gate 506 may be used in conjunction with tristate buffer 504 to pass signals between local data line 409 and global data line 410. In particular, pass transistor 506 may be turned on by asserting enable signal Ven1 during read operations while tristate buffer 504 may be activated by asserting enable signal Ven2 during write operations.

Figure 6:
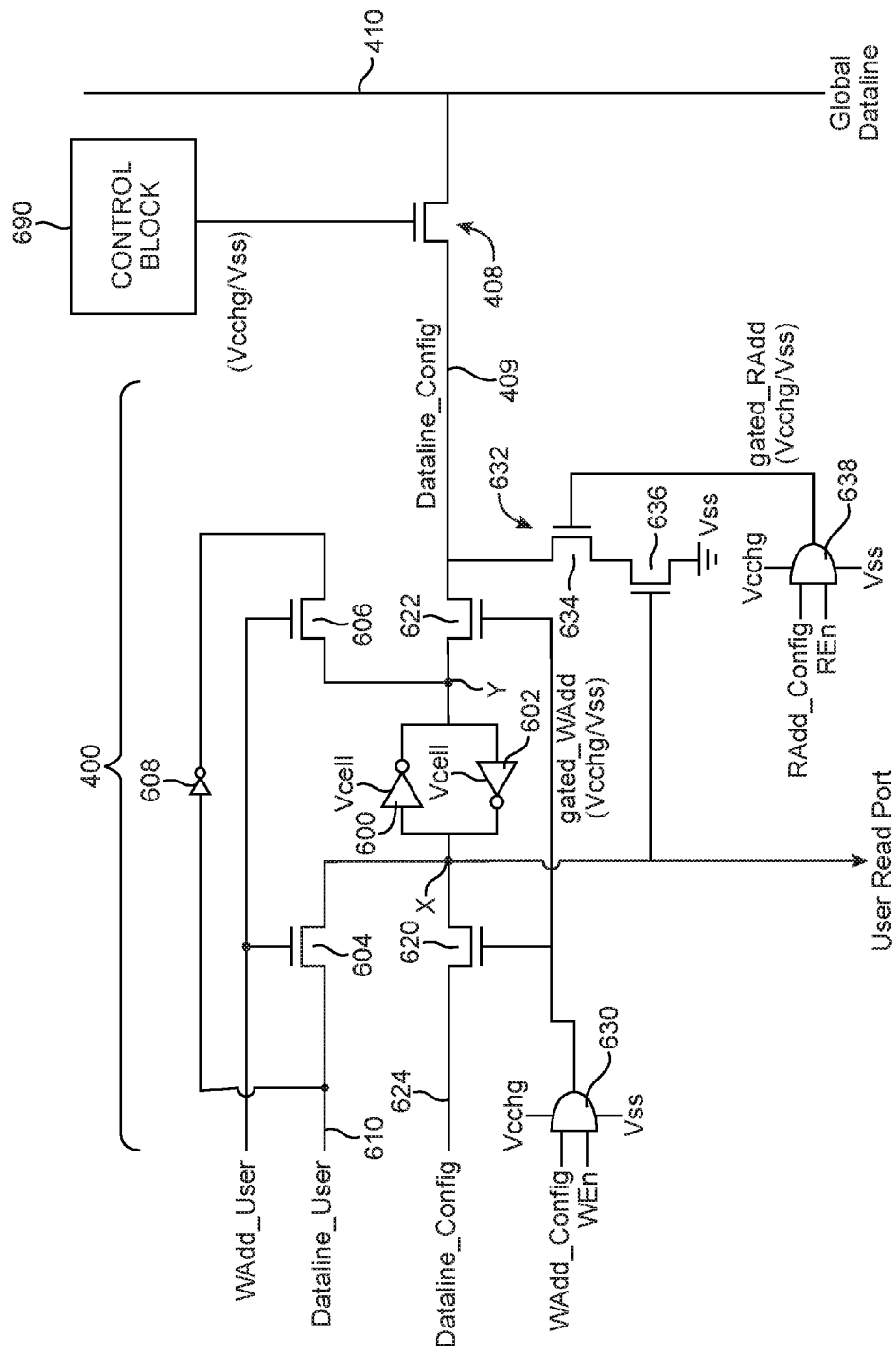
FIG. 6 is a circuit diagram showing one suitable implementation of a dual mode memory cell that is coupled to a global data line via a pass gate transistor in accordance with an embodiment.

FIG. 6 is a circuit diagram showing one suitable implementation of dual mode memory cell 400 that is coupled to global data line 410 using the hierarchical routing arrangement of FIG. 4. As shown in FIG. 6, memory cell 400 may include cross-coupled inverters 600 and 602 that form a bistable element. Inverters 600 and 602 may be powered using memory cell voltage Vcell, which is typically lower than voltage Vcchg. For example, if Vcchg is equal to 1.1 V, voltage Vcell may be equal to 0.90 V. Inverter 600 may have an input that is connected to data storage node X, which is driven by the output of inverter 602. Inverter 602 may have an input that is connected to data storage node Y, which is driven by the output of inverter 600.

A user data line such as data line 610 may be coupled to node X via access transistor 604 and also coupled to node Y via inverter 608 and access transistor 606. Access transistors 604 and 606 may be controlled by user write address signal WAdd_User and may serve collectively as the user write port. The user write port may swing between power supply voltages Vcchg and Vss. Node X may serve as the user read port and may swing between voltage levels Vcell and Vss.

A first configuration data line 624 may be coupled to node X via access transistor 620, whereas a second configuration data line Dataline_Config' (i.e., local data line 409) may be coupled to node Y via access transistor 622. Access transistors 620 and 622 may be controlled by write address signal gating logic 630. In particular, gating logic 630 may be a logic AND gate having a first input that receives configuration write address signal WAdd_Config, a second input that receives a write enable signal WEn, and an output at which a corresponding gated write address signal gate_WAdd is provided. During configuration write mode, signal WEn may be asserted (i.e., driven high) when cell 400 is configured to operate as lookup-table mode (LUT-mode) or may be deasserted (i.e., driven low) when cell 400 is configured to operate as memory mode. Since gating logic 630 is powered using voltage levels Vcchg and Vss, gated write address signal gated_WAdd will only swing between Vcchg and Vss. Access transistors 620 and 622 controlled by gated address signal gated_WAdd may serve collectively as the configuration write port for memory cell 400.

Data line 409 may also be coupled to a configuration read circuit such as read circuit 632. Read circuit 632 may include pull-down transistors 634 and 636 coupled in series between data line 409 and the ground line. Transistor 636 may have a gate terminal that is connected to node X. Transistor 634 may have a gate terminal that is coupled to read address signal gating logic 638. In particular, gating logic 638 may be a logic AND gate having a first input that receives configuration read address signal RAdd_Config, a second input that receives a read enable signal REn, and an output at which a corresponding gated read address signal gate_RAdd is provided. During configuration read mode, signal REn may be asserted (i.e., driven high) when cell 400 is configured to operate as lookup-table mode (LUT-mode) or may be deasserted (i.e., driven low) when cell 400 is configured to operate as memory mode. Since gating logic 638 is powered using voltage levels Vcchg and Vss, gated read address signal gated_RAdd will only swing between Vcchg and Vss. Read access transistors 634 and 636 controlled by gated address signal gated_RAdd may serve collectively as the configuration read port for memory cell 400.

FIG. 6 further shows how pass gate switch 408, which connects local data line 409 to global data line 410, may receive a control signal from control block 690. The control signal output by control block 690 may swing between voltage levels Vcchg and Vss. Configured in this way, dual mode memory cell 400 includes gating logic for selectively gating off the configuration read/write ports during the configuration mode, while all address signals are allowed to toggle between voltage levels Vcchg and Vss while keeping leakage low due to the hierarchical data line arrangement.

Figure 7:
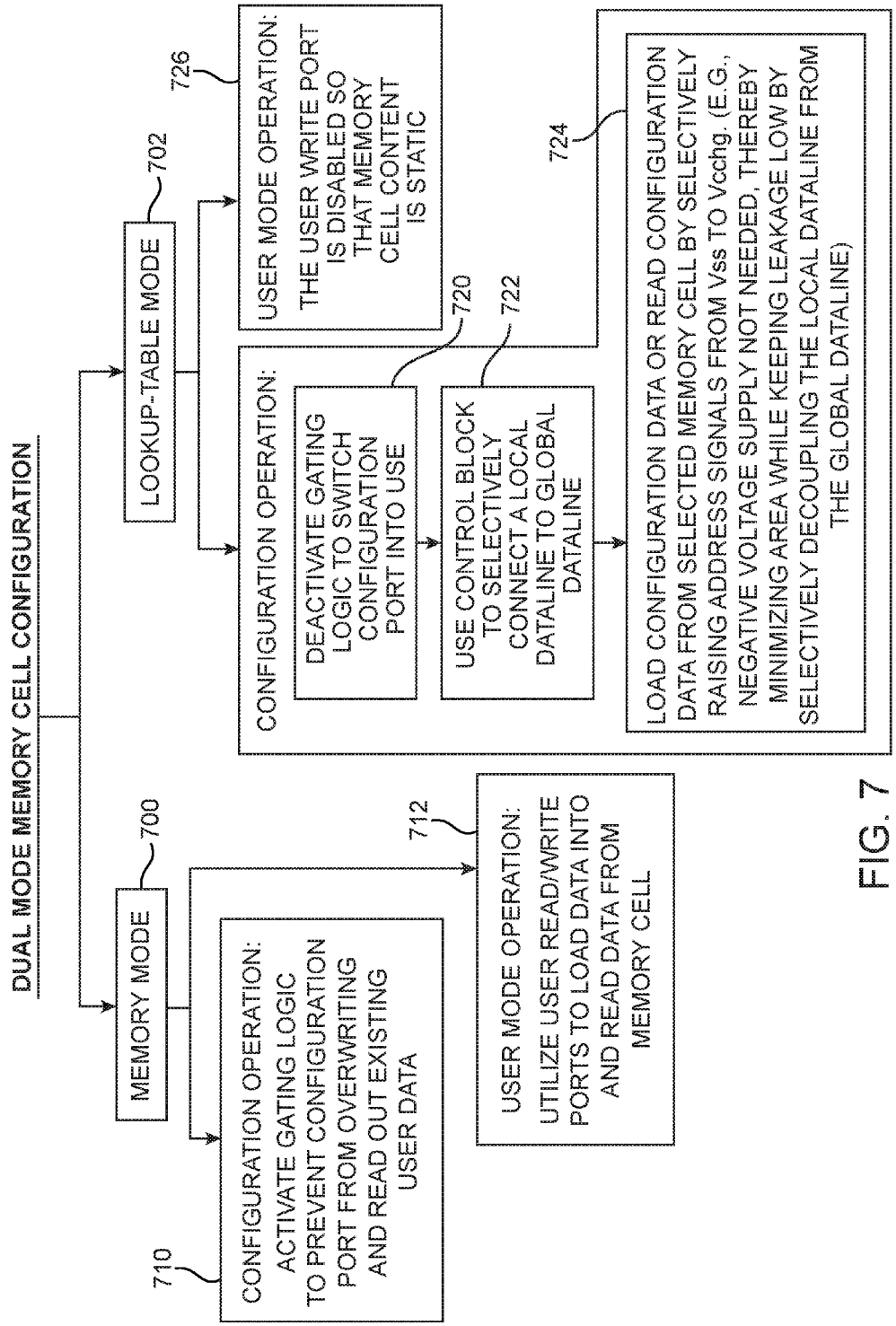
FIG. 7 is a state diagram showing illustrative steps for operating dual mode memory cells arranged in a hierarchical data line configuration to help minimize data line leakage in accordance with an embodiment.

FIG. 7 is a state diagram showing illustrative steps for operating dual mode memory cells arranged in a hierarchical data line configuration to help minimize data line leakage, and hence improves the dual mode memory cell read margin. As shown in FIG. 7, a dual mode memory cell (see, e.g., dual mode memory cell 400 of the type described in connection with FIGS. 4-6) may be configured to operate in either memory mode 700 or lookup-table mode (LUT mode) 702.

When the memory cell is configured to operate in memory mode 700, steps 710 and 712 may be performed. At step 710 (e.g. partial reconfiguration, scrubbing, error detection and correction, and other configuration operations), the gating logic may be activated to prevent the configuration ports from overwriting and reading out any existing user data (e.g., gating logic 630 and 638 of FIG. 6 may be gated off by deasserting signals WEn and REn). At step 712 (e.g., user mode operation), the user read and write ports may be used to load user data into and read user data from a selected memory cell.

When the memory cell is configured to operate in LUT mode 702, steps 720, 722, and 724 may be performed during configuration operations (e.g. partial reconfiguration, scrubbing, error detection and correction, and other configuration operations). At step 720, the gating logic may be deactivated to switch the configuration ports into use (e.g., gating logic 630 and 638 of FIG. 6 may receive asserted signals WEn and REn). At step 722, control block 690 may be used to selectively assert a control signal to connect one of the local data lines to the global data line. At step 724, the configuration port may be used to load configuration data into or read configuration data from a selected dual mode memory cell by raising a corresponding gated address signal from ground voltage level Vss to elevated voltage level Vcchg.

At step 726 (e.g., during user mode operation), the user write port is disabled since the user is not supposed to overwrite memory cell contents when it is configured as LUT mode. The memory cell stores static configured data for a lookup table, for configuring programmable circuitry on the integrated circuit, etc. In particular, a negative address signal Vneg is not needed since leakage is kept to a minimum by selectively decoupling the global data line from a majority of the local data lines.

These steps are merely illustrative. The existing steps may be modified or omitted; some of the steps may be performed in parallel; additional steps may be added; and the order of certain steps may be reversed or altered. Also, the example of FIG. 7 in which memory cells 400 are only operated in two different modes is merely illustrative. If desired, memory cells 400 may be any suitable type of multimode memory cells operable in three or more different modes, five or more different modes, ten or more different modes, etc.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA/INTEL Corporation.

The foregoing is merely illustrative of the principles of this invention and various modifications can be made by those skilled in the art. The foregoing embodiments may be implemented individually or in any combination.

What is claimed is:
1. An integrated circuit, comprising:
a first dual mode memory cell;
a second dual mode memory cell, wherein the first and second dual mode memory cells are operable in a configuration mode and a user memory mode, and wherein the first and second dual mode memory cells store user data bits when operating in the user memory mode and supply configuration bits that are different than the user data bits when operating in the configuration mode;
a local data line that is connected to the first dual mode memory cell and the second dual mode memory cell;
a global data line; and
a circuit that selectively couples the local data line to the global data line.

2. The integrated circuit of claim 1, wherein the circuit comprises a pass gate transistor.
3. The integrated circuit of claim 1, wherein the circuit comprises a bidirectional tristate buffer.
4. The integrated circuit of claim 1, further comprising:
a third dual mode memory cell;
a fourth dual mode memory cell;
an additional local data line that is connected to the third dual mode memory cell and the fourth dual mode memory cell; and
an additional circuit that selectively couples the additional local data line to the global data line.
5. The integrated circuit of claim 1, further comprising programmable logic circuitry controlled by the configuration bits.
6. The integrated circuit of claim 1, wherein the configuration bits in the first and second dual mode memory cells are overwritten during device reconfiguration operations.
7. An integrated circuit, comprising:
a first dual mode memory cell;
a second dual mode memory cell, wherein the first and second dual mode memory cells are operable in a configuration mode and a user memory mode, and wherein the first and second dual mode memory cells each have a configuration port and a user port;
a local data line that is connected to the first dual mode memory cell and the second dual mode memory cell;
a global data line;
a circuit that selectively couples the local data line to the global data line; and
gating logic at the configuration port, wherein the configuration port is gated off by the gating logic while the first and second dual mode memory cells are operated in the user memory mode.
8. The integrated circuit of claim 7, wherein the first and second dual mode memory cells are powered using a memory cell supply voltage and a ground power supply voltage, and wherein the configuration port is addressed using signals that swing between the ground power supply voltage and an overdrive voltage that is greater than the memory cell supply voltage.
9. The integrated circuit of claim 7, wherein the gating logic comprises a logic AND gate.
10. A method for operating an integrated circuit, comprising:
operating a plurality of dual mode memory cells in a memory mode;
operating the plurality of dual mode memory cells in a lookup-table (LUT) mode that is different than the memory mode, wherein the plurality of dual mode memory cells is connected to a local data line, and wherein each dual mode memory cell in the plurality of dual mode memory cells has a user port for supporting a user mode operation and a configuration port for supporting a configuration operation;
with a circuit, selectively coupling the local data line to a global data line; and
gating the configuration port during the memory mode.
11. The method of claim 10, further comprising:
not gating the configuration port during the LUT mode.
12. The method of claim 10, wherein gating the configuration port comprises outputting an address signal at a ground power supply voltage level to at least one of the plurality of dual mode memory cells.
13. The method of claim 10, further comprising:
with a control block, selectively outputting an asserted control signal to activate the circuit.

14. The method of claim 10, further comprising using the global data line to load data into the plurality of dual mode memory cells.

\* \* \* \* \*